United States Patent

Shu

Patent Number: 5,525,839
Date of Patent: Jun. 11, 1996

[54] METHOD OF PACKING AN IC DIE IN A MOLDED PLASTIC EMPLOYING AN ULTRA-THIN DIE COATING PROCESS

[75] Inventor: William K. Shu, Sunnyvale, Calif.

[73] Assignee: VLSI Technology, Inc., San Jose, Calif.

[21] Appl. No.: 366,699

[22] Filed: Dec. 30, 1994

[51] Int. Cl.$^6$ .............................. H01L 23/48; H01L 23/52
[52] U.S. Cl. ............................................ 257/780; 257/784
[58] Field of Search ..................................... 257/780, 784, 257/767, 787–791, 738, 737

[56] References Cited

U.S. PATENT DOCUMENTS

| 4,499,149 | 2/1985 | Berger | 257/788 |
| 5,023,697 | 6/1991 | Tsumura | 257/780 |
| 5,157,061 | 10/1992 | Ito et al. | 523/433 |

Primary Examiner—Sara W. Crane
Assistant Examiner—Jhihan Clark
Attorney, Agent, or Firm—Majestic, Parson, Seibert & Hsue

[57] ABSTRACT

A process for forming a stress relief layer on a semiconductor die and the resulting structure of the process is described. The stress relief layer is formed on a surface of a die which has already been attached to a die attach pad of a lead frame by a cured epoxy. The purpose of the layer is to act as a stress relief buffer by relieving the die surface from contraction forces created by a plastic material used for encapsulating the die and die attach pad portion of the lead frame, as the plastic material cools following hot injection molding of the material to form the encapsulation. Prior to application of the stress relief material onto the surface of the die, the surface is cleaned to restore its high surface energy. The stress relief material is formed by diluting a silicone compound with a non-reactive diluent such as a silicone oil so that both the surface energy and viscosity of the silicone compound is reduced. Following application of the stress relief material onto the surface of the semiconductor die, the applied layer is cured and as a consequence, the non-reactive diluent evaporates out of the applied stress relief layer.

4 Claims, 2 Drawing Sheets

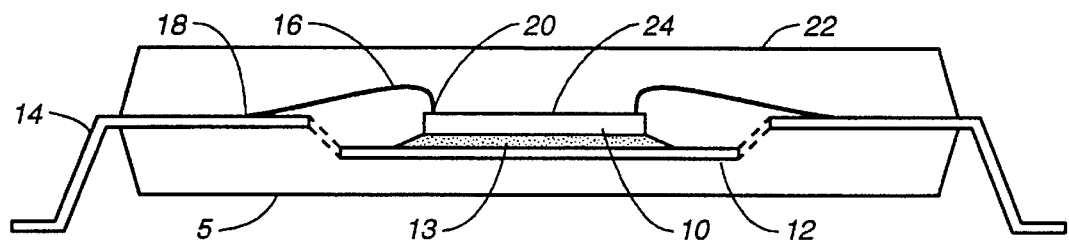
FIG._1A
(PRIOR ART)
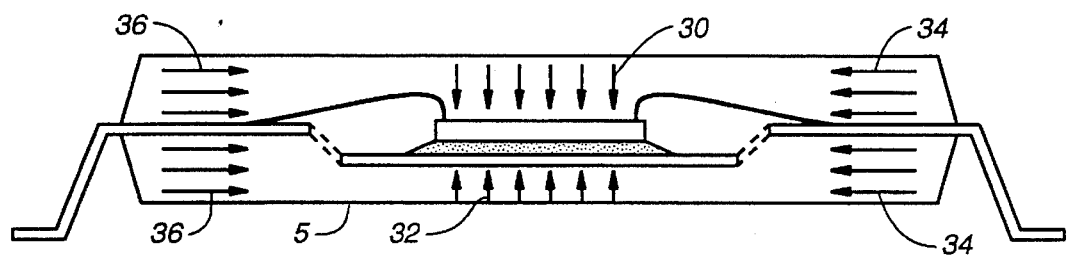
FIG._1B
(PRIOR ART)
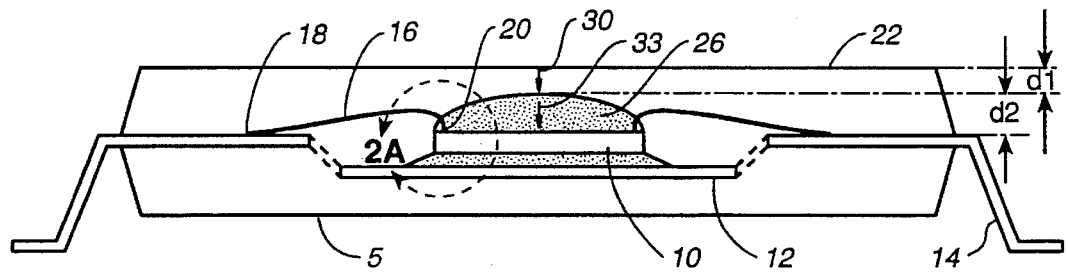
FIG._2
(PRIOR ART)

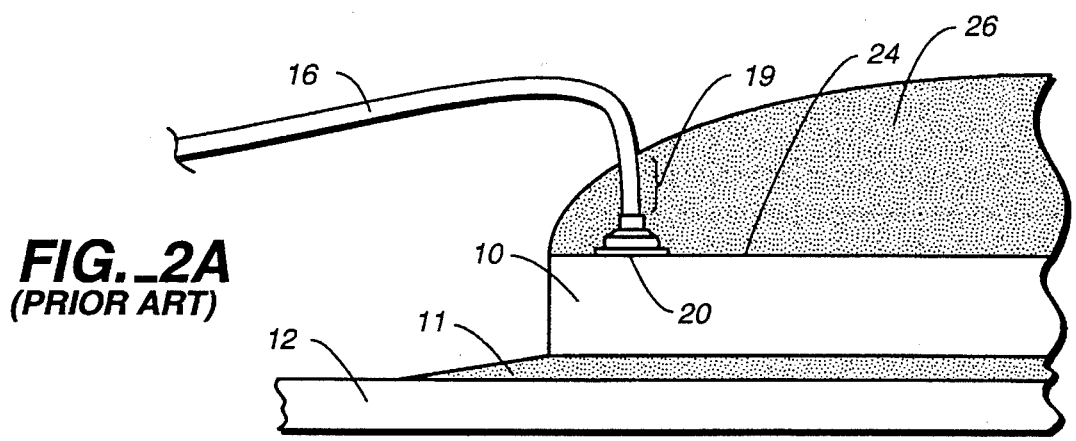
FIG._2A
(PRIOR ART)
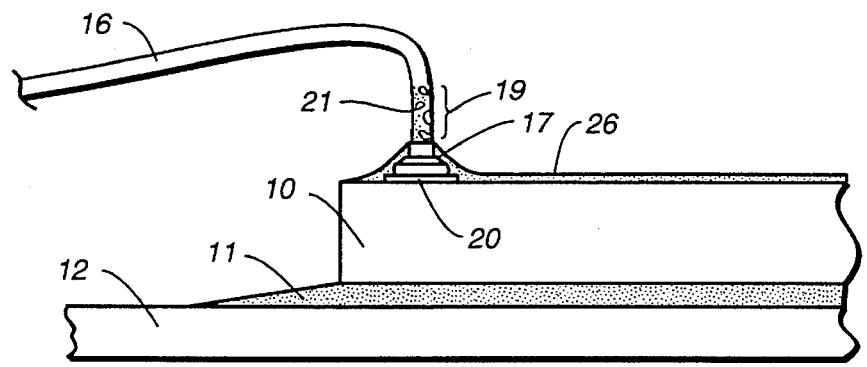
FIG._3
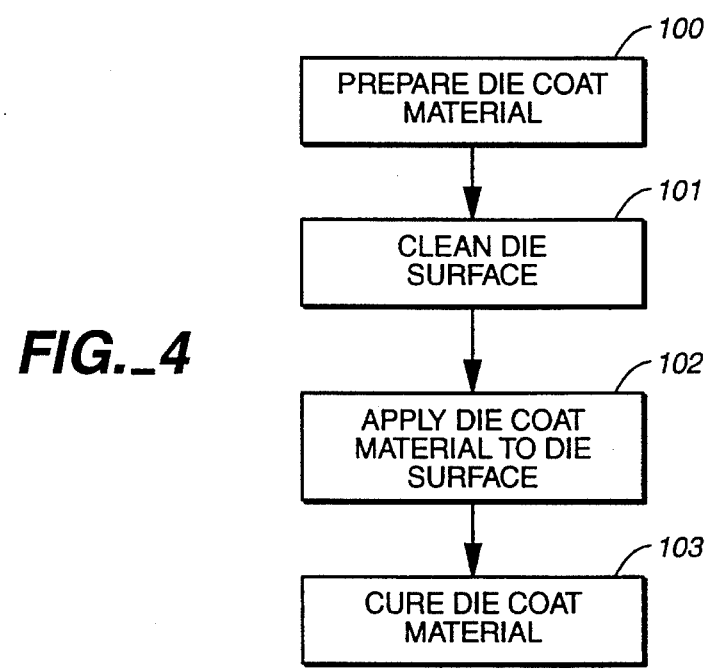
FIG._4

METHOD OF PACKING AN IC DIE IN A MOLDED PLASTIC EMPLOYING AN ULTRA-THIN DIE COATING PROCESS

BACKGROUND OF THE INVENTION

This invention relates in general to integrated circuit packaging techniques and in particular, to a method of packaging an integrated circuit die in a molded plastic package including the formation of a coating of stress relief material on a surface of the integrated circuit die prior to transfer molding the integrated circuit die.

Conventional techniques for packaging integrated circuit ("IC") die in molded plastic packages can cause cracks in the die as a result of stress created by thermal expansion mismatch between the die and the molding compound. In FIG. 1a, for example, a cross-sectional view of a plastic packaged IC 5 is shown in which an IC die 10 is mechanically supported by a die attach pad 12 which is itself supported by and connected to a lead frame having a number of leads such as lead 14. Electrical connection from a bond pad (not shown) on the IC die 10 to the lead 14 is made by a bonding wire 16 which is attached to the IC die 10 at bonding point 20 and attached to the lead 14 at bonding point 18. Similar electrical connections are made by bonding other wires to other bond pads of the die and other leads of the lead frame. The thus connected die and lead frame structure is then encapsulated in a molded plastic package 22 by conventional transfer molding techniques. After injection molding, the plastic is allowed to cool back to room temperature and as shown in FIG. 1b, contraction forces 30, 32, 34 and 36 act against the IC die 10 and lead frame structure.

In order to reduce the stress on the die surface, die coatings with lower modulus of elasticity and/or thermal coefficients of expansion characteristics have been applied to the die surface to act as a buffer or stress relief layer between the molded plastic package and the die surface. Although these methods have been satisfactory for coating relatively small die surface areas, they do not promise such satisfactory results for coating the larger die surface areas that are becoming prevalent as die sizes approach wafer scale integration sizes.

Under current die coating processes, the resulting die coating layer (also referred to herein as "stress relief layer") tends to "mound up" and generally either fails to cover the entire die surface or if it does cover the entire die surface, tends to cause thermally induced shearing forces at the die coating to molded plastic interface that can cut the wires bonded to the die.

The effects of other problems with current die coating processes are also expected to increase as the dimensions of IC die increase. First of all, the combined stress and shearing forces on the die surface caused by the hot plastic mold material contracting as it cools to room temperature, increase exponentially from the center of the die to the outer edges of the die. If the die coating fails to cover the entire surface of the die, it is the outer edges which are being subjected to the largest thermal forces that are left uncovered and consequently, are the areas most likely on the die to experience cracking.

Secondly, as the dimensions of the IC die increase, the height of the mound of die coating material increases accordingly. As the height of the mound of die coating material increases in the center of the die, the molded plastic material over this area correspondingly decreases and as a result, the mechanical strength and integrity of the plastic package over this area diminishes.

For example, FIG. 2 illustrates a layer of stress relief material 26 on the surface 24 of IC die 10. The IC die 10 is otherwise wire bonded to a lead frame and packaged in molded plastic as described in reference to FIG. 1a. In FIG. 2, however, IC die 10 is buffered from the contracting forces 30 of the molded plastic 22 by the layer of stress relief material 26. By selecting a stress relief material with a lower modulus of elasticity and/or thermal coefficient of expansion than the plastic material 22, the contracting forces 33 caused by the stress relief material cooling to room temperature along with the molded plastic 22, places less stress on the die surface 24 than the forces 30 of the molded plastic 22.

The stress relief layer 26 is shown to be shaped like a mound having a height d2. As the height of the stress relief layer 26 increases, the thickness d1 of the plastic material 22 above the surface of the stress relief layer 26 correspondingly decreases. As a result, the mechanical strength and integrity of the plastic package at this point is reduced. To ensure that the entire die surface 24 is covered with stress relief material, however, it is desirable to increase the height of the stress relief layer 26. Thus, because the stress relief material 26 has a tendency to form a mound, a trade-off is required between either not fully covering the die surface, or fully covering the die surface and consequently, weakening the mechanical strength and integrity of the plastic package over the center of the die.

OBJECTS AND SUMMARY OF THE INVENTION

From the foregoing, it is evident that current die coating processes are worthy of improvement. The need for such improvement is especially evident as the dimensions of the IC die to be packaged increase.

A first observation related to the present invention is that contaminants situated on the die surface are believed to be a major causal factor in the layer of stress relief material forming a mound when it is applied over the die surface. Such contaminants lower the surface energy of the die and as a result, restrict the flow of the stress relief material over the die surface causing the stress relief material to "mound up".

A second observation related to the present invention is that by maintaining the height of the layer of stress relief material below that of the ball neck area formed where the wire bonds are bonded to the die, shearing forces resulting from subsequent thermal expansion at the surface interface between the layer of stress relief material and the plastic mold material are substantially less likely to cut the bond wires than if the surface interface was at the ball neck area. Additionally, maintaining the height of the layer of stress relief material below that of the ball neck area is preferable to having the height of the layer above that area, because it maximizes the thickness of the plastic mold material over the die surface which consequently, maximizes the mechanical strength and integrity of the plastic package.

A third observation related to the present invention is that an ultra-thin die coat works as a decoupling layer separating the surface of the die from the molding compound. This decoupling layer prevents molding compound from adhering to the die surface. When the molding compound contracts during the cooling period after molding, the molding compound slides over the coating layer thus greatly reducing the shear stress exerted on the die and preventing the die from cracking.

Accordingly, one object of the present invention is to coat the entire die surface with a layer of stress relief material without subjecting the wire bonds attached to the die to excessive shearing forces arising from subsequent thermal expansion differences at the interface surface between the stress relief material and the plastic package, that would tend to cut the wire bonds.

Another object of the present invention is to coat the entire die surface with a layer of stress relief material that is substantially of uniform height over the entire die surface, and of minimum height, so that the plastic mold material over the entire die surface is as thick as possible in order to ensure maximum mechanical strength and integrity of the package.

These and additional objects are accomplished by the various aspects of the present invention, wherein a first aspect of the present invention is a method of packaging an IC die in a molded plastic package, comprising, after the steps of placing the IC die on a die-attach material deposited on a die-attach structure, curing the die-attach material, and bonding wire bonds to a surface of the integrated circuit die, and before the step of transfer molding the integrated circuit die, the steps of: cleaning the surface of the integrated circuit die; and coating the clean surface with a layer of stress relief material.

Another aspect of the present invention is a structure formed within a molded plastic package comprising: a semiconductor die having a surface; a wire having two ends, one end being bonded to the surface of the semiconductor die at an attachment point, the wire forming a bond ball at the attachment point, the bond ball having a neck with enlarged metallic grains; and a layer of stress relief material covering the surface of the semiconductor die, but not covering the enlarged metallic grains of the neck of the bond ball.

Additional objects, features and advantages of the various aspects of the present invention will become apparent from the following description of its preferred embodiment, which description should be taken in conjunction with the accompanying drawings.

BRIEF DESCRIPTION OF THE DRAWINGS

FIGS. 1a and 1b illustrate a cross-sectional view of a integrated circuit die packaged in molded plastic without a coating of stress relief material on the surface of the die;

FIG. 2 illustrates a cross-sectional view of a integrated circuit die packaged in molded plastic with a coating of stress relief material on the surface of the die;

FIG. 3 illustrates a cross-sectional view of the bond wire to die surface attachment; and FIG. 4 illustrates a process flow utilizing aspects of the present invention, for forming a coating of stress relief material on the surface of a die.

DETAILED DESCRIPTION OF THE PREFERRED EMBODIMENT

In order for a liquid to cover a solid surface, the surface energy of the liquid must be smaller than that of the solid. This requirement is described by Young's equation:

$$\gamma_{SV} > \gamma_{SL} + \gamma_{LV} \quad (1)$$

where:

$\gamma_{SV}$=Surface energy of the solid in the presence of vapor of the liquid;

$\gamma_{SL}$=Solid-liquid interfacial energy; and $\gamma_{LV}$=Surface energy of the liquid.

In the current application, the exposed surface of a semiconductor die primarily consists of aluminum metal bond pads in preselected bonding areas and a glassivation layer everywhere else to protect the active circuitry underneath it. Being a metal and an oxide, respectively, the aluminum metal bond pads and the glassivation layer typically have high surface energies in the hundreds or thousands of $mJ/M^2$. On the other hand, polymers, such as the epoxy used in die attach material and the silicone used in die coat material, typically have low surface energies in the 50 or 100 $mJ/M^2$ range.

In principle, therefore, using a stress relief or die coat material such as silicone should allow the stress relief material to completely wet the die surface. In practice, however, this rarely occurs. Instead, the silicone stress relief material tends to form a mound and not cover the entire die surface, especially the corners of the die. As it turns out, the silicone stress relief material is easily stopped by ridges on the die surface formed by underlying metal line structures.

The non-wetting and consequentially resulting, mounding behavior of the silicone stress relief material is primarily caused by two factors, the viscosity of the material and the actual die surface that the material comes in contact with. High viscosity can slow down the spreading of the stress relief material on the die surface, and the actual die surface that the material comes in contact with has a much lower surface energy than that expected in principle.

The reason why the stress relief material actually contacts a much lower surface energy from the die surface than that expected is because the die surface, being a high energy surface, is reactive and unstable, and as a consequence, is often covered by low surface energy contaminants such as water or organic vapors. For example, in a semiconductor assembly process, the IC die 10 (FIG. 1a) is attached to the lead frame die attach pad 12 (FIG. 1a) by epoxy 13. In order for the die-attach epoxy to cure bake, the IC die is typically baked in an oven for 1 to 2 hours at 150° to 175° C. During the bake, the oven is filled with low surface energy, low molecular weight organic materials outgassing from the die-attach epoxy. Because of the long bake period, ample opportunity is provided for the epoxy outgassing material to redeposit on the die surface and as a consequence, reduce its surface energy.

To restore the die surface to its original high energy surface, removal of the epoxy outgassing material from the surface of the IC die is preferable. With the contaminants thus removed from the die surface, the lower surface energy stress relief or die coating material can then easily flow to cover the entire die surface. As a consequence of facilitating the flow of stress relief material over the die surface, the mounting behavior of the stress relief material is significantly diminished and as a result, the height d2 (FIG. 2) of the stress relief material 26 (FIG. 2) required to completely cover the surface of the die is significantly reduced. In addition, evaporation of non-reactive diluents from the die coating material during curing of the die coating material also further reduces the thickness of the die coating material, thus resulting in an "ultra-thin" layer of die coating or stress relief material 26 on the die surface.

A number of cleaning methods can be used to remove contaminants from the die surface after die-attach and epoxy bake. For example, either a ultrasonic, plasma dry etch or ozone cleaning process would be acceptable. Although solvents or acids could be used, submerging the leadframe and attached die in a solvent or acid bath could cause adjacent bonding wires to bend towards each other and cause shorts, or could cause adverse chemical reactions with certain parts of the structure being submerged.

In addition to cleaning the die surface to facilitate the flow of a coating of stress relief material over it, it is also desirable to both minimize the height of the resulting layer of stress relief material, as well as, keeping the height of the resulting layer away from the ball neck area formed where the wire bonds are bonded to bond pads on the die surface.

Referring back to FIG. 2, by minimizing the height d2 of the resulting layer of stress relief material 26, the thickness d1 of the plastic mold material 22 directly over the die surface 24 and layer of stress relief material 26, is maximized. By maximizing the thickness d1 of the plastic mold material 22 at this point, the mechanical strength and integrity of the molded plastic package is maximized.

Referring now to FIG. 3, a bonding ball 17 formed at one end of a bonding wire 16 is shown to be attached to an IC die 10 which is itself attached to a die attach pad 12 by a layer of epoxy 11, at a bonding point 20. On a ball neck area 19 of the bonding wire 16, enlarged metallic grains 21 formed during wire bonding of the bonding wire to an IC bond pad of the IC die 10 by a wire bonder are shown. This area comprising the enlarged metallic grains 21 is the weakest portion of the bonding wire 16.

In prior art processes, to avoid the weak ball neck area 19 of the wire bond 16, now referring back to FIG. 2, the coating of stress relief material 26 was intentionally made thick enough so that it not only would cover the entire surface 24 of the die 10, but also be high enough to ensure that the coating surface is well above the weak ball neck area 19. As previously pointed out, however, increasing the height d2 of the layer of stress relief material 26 consequentially results in decreasing the thickness d1 of the plastic mold material 22 over the die 10, which in turn, results in mechanically weakening this area of the plastic package.

Accordingly, it is preferable to apply a layer of stress relief material 26 that not only covers the entire surface 24 of the die 10, but also is thin enough to ensure that the layer of stress relief material 26 is well below the weak ball neck area 19 (FIG. 3). An ultra-thin coating of stress relief material that satisfies these requirements, alone or in conjunction with the surface cleaning aspect of the present invention, is a composition formed by mixing one of the conventional materials used for die coating, such as either silicone polymers or polyimides, with an appropriate diluent.

The ultra-thin coating is effectively achieved by reducing both the surface energy $\gamma_{LV}$ and the viscosity of the stress relief material. Although either reactive and/or non-reactive modifiers can be added to the stress relief material to reduce its surface energy $\gamma_{LV}$, to reduce the viscosity of the stress relief material, a non-reactive diluent is desirable. Further, a non-reactive diluent also has the advantage that it does not become part of the cross-link network and consequently, will evaporate out of the system during curing of the die coat material after application on the die surface. After diluent evaporation, the coating material approaches a single molecular layer thickness on the die surface.

A non-reactive diluent is therefore preferable. In the preferred composition, for example, a low molecular weight silicone oil is used as a non-reactive diluent with a silicone polymer die coating material using a high dilution ratio such as, for example, 20:1.

FIG. 4 illustrates, as an example, a process flow chart, utilizing aspects of the present invention, for forming a layer of stress relief material on a semiconductor die surface after the die has been attached to a die attach pad of a lead frame. In step 100, the die coat material is mixed by diluting a silicone polymer material with a silicone oil in the proportions and manner previously described.

In step 101, the die surface is cleaned by any of the processes previously described. Although step 100 is shown to occur prior to step 101 in the flow chart, it is to be understood that step 100 could also occur concurrently with or after step 101.

In step 102, the prepared die coat or stress relief material is applied to the cleaned die surface by conventional methods. For example, a conventional pneumatic dispenser could be used to place a small drop in the center of the die surface. Since the die surface has been cleaned to restore its high surface energy, the use of centrifugal force to spread the die material onto the die surface by spinning the die, is unnecessary. Surface tension forces alone are sufficient to spread the die coat material.

In step 103, the die coat material is cured following application to the die surface. As previously mentioned, if a non-reactive diluent has been added to the original die coat material, the non-reactive diluent will evaporate out of the cured die coating at this stage. Consequently, the die coating effectively shrinks in height after this curing step.

Although the various aspects of the present invention have been described with respect to a preferred embodiment, it will be understood that the invention is entitled to full protection within the full scope of the appended claims.

What is claimed is:

1. A structure formed within a molded plastic package comprising:

a semiconductor die having a surface;

a wire bonded at an attachment point to said surface of said semiconductor die, said wire forming a bond ball at said attachment point, said bond ball having a neck with enlarged metallic grains; and a layer of stress relief material covering the entire surface of said semiconductor die including an area wherein said bond ball attaches to said surface of said semiconductor die at said attachment point, but not covering said enlarged metallic grains of said neck of said bond ball.

2. The structure as recited in claim 1, wherein said layer of stress relief material comprises a mixture of a silicone compound and a non-reactive diluent.

3. The structure as recited in claim 1, wherein said layer of stress relief material comprises a mixture of a silicone compound and a silicon oil.

4. The structure as recited in claim 2, wherein said mixture of silicone compound and non-reactive diluent comprises a ratio of at least 20 parts of said non-reactive diluent to 1 part of said silicone compound.

* * * * *

UNITED STATES PATENT AND TRADEMARK OFFICE
CERTIFICATE OF CORRECTION

PATENT NO. : 5,525,839
DATED : Jun. 11, 1996
INVENTOR(S) : William K. Shu

It is certified that error appears in the above-indentified patent and that said Letters Patent is hereby corrected as shown below:

On the title page: Item [54] and Column 1, line 2, after "Plastic" insert --Package--.

Signed and Sealed this

Ninth Day of December, 1997

*Attest:*

BRUCE LEHMAN

*Attesting Officer*  *Commissioner of Patents and Trademarks*